(12) United States Patent
Hsiao et al.

(10) Patent No.: US 10,256,844 B2
(45) Date of Patent: Apr. 9, 2019

(54) DECODING METHOD, MEMORY STORAGE DEVICE AND MEMORY CONTROL CIRCUIT UNIT

(71) Applicant: Shenzhen EpoStar Electronics Limited CO., Shenzhen OT (CN)

(72) Inventors: Yu-Hua Hsiao, Hsinchu County (TW); Heng-Lin Yen, Hsinchu County (TW); Hung-Chi Chang, Hsinchu (TW)

(73) Assignee: Shenzhen EpoStar Electronics Limited CO., Shenzhen (CN)

( * ) Notice: Subject to any disclaimer, the term of this patent is extended or adjusted under 35 U.S.C. 154(b) by 0 days.

(21) Appl. No.: 15/250,925

(22) Filed: Aug. 30, 2016

(65) Prior Publication Data

US 2018/0013450 A1 Jan. 11, 2018

(30) Foreign Application Priority Data

Jul. 5, 2016 (TW) .............................. 105121218 A

(51) Int. Cl.
*H03M 13/37* (2006.01)
*H03M 13/35* (2006.01)
(Continued)

(52) U.S. Cl.
CPC ....... *H03M 13/353* (2013.01); *G06F 11/1048* (2013.01); *G06F 11/1068* (2013.01);
(Continued)

(58) Field of Classification Search
CPC ............. G06F 11/1076; G06F 11/1008; G06F 11/106; G06F 11/1068; H05K 999/99;
(Continued)

(56) References Cited

U.S. PATENT DOCUMENTS 4,038,636 A 7/1977 Doland
6,987,511 B2 1/2006 Taubin
(Continued)

OTHER PUBLICATIONS

"Office Action of Taiwan Counterpart Application," issued on Apr. 20, 2017, pp. 1-9, in which the listed references were cited.

*Primary Examiner* — Samir W Rizk
*Assistant Examiner* — Enam Ahmed
(74) *Attorney, Agent, or Firm* — JCIPRNET

(57) ABSTRACT

A decoding method, a memory storage device, and a memory control circuit unit are provided. The decoding method includes: reading a codeword from a memory module and estimating error level information of the codeword; inputting the codeword and the error level information to an error checking and correcting circuit through a first message channel and a second message channel respectively; determining whether the error level information meets a default condition; if yes, inputting the codeword to a first decoding engine of the error checking and correcting circuit for decoding; otherwise, inputting the codeword to a second decoding engine of the error checking and correcting circuit for decoding, wherein a power consumption of the first decoding engine is lower than that of the second decoding engine, and a decoding success rate of the first decoding engine is lower than that of the second decoding engine. Therefore, an operating flexibility for decoding may be improved.

21 Claims, 7 Drawing Sheets

(51) Int. Cl.
*G06F 11/10* (2006.01)
*G11C 29/52* (2006.01)
*H03M 13/00* (2006.01)
*H03M 13/11* (2006.01)

(52) U.S. Cl.
CPC ......... *G11C 29/52* (2013.01); *H03M 13/3715* (2013.01); *H03M 13/6502* (2013.01); *H03M 13/1102* (2013.01); *H03M 13/1108* (2013.01); *H03M 13/1111* (2013.01)

(58) Field of Classification Search
CPC ........... G11C 2029/0411; G11C 29/52; H03M 13/353; H03M 13/3715; H03M 13/6502; H03M 13/1111; H03M 13/1108; H03M 13/1102
USPC ....................................................... 714/764
See application file for complete search history.

(56) References Cited

U.S. PATENT DOCUMENTS

| | | | |
|---|---|---|---|
| 8,631,309 B2 * | 1/2014 | Graumann | H03M 13/1148 714/764 |
| 8,791,803 B2 | 7/2014 | Ishikawa | |
| 8,966,339 B1 | 2/2015 | Lu | |
| 9,026,886 B1 | 5/2015 | Yeo | |
| 9,070,467 B2 | 6/2015 | Kim et al. | |
| 2001/0001616 A1 * | 5/2001 | Rakib | H03M 13/256 375/259 |
| 2003/0135798 A1 * | 7/2003 | Katayama | G11B 20/1833 714/710 |
| 2009/0125671 A1 * | 5/2009 | Flynn | G06F 9/52 711/103 |
| 2010/0005366 A1 * | 1/2010 | Dell | G06F 11/073 714/758 |
| 2012/0001778 A1 * | 1/2012 | Steiner | H03M 13/09 341/94 |
| 2015/0067446 A1 * | 3/2015 | Yen | H03M 13/1105 714/768 |
| 2015/0205664 A1 * | 7/2015 | Janik | G06F 11/1012 714/764 |
| 2015/0293811 A1 * | 10/2015 | Lin | G06F 11/1008 714/773 |
| 2015/0309869 A1 * | 10/2015 | Mittelholzer | G06F 11/1012 714/764 |
| 2015/0349807 A1 * | 12/2015 | Vernon | H03M 13/353 714/774 |
| 2016/0103732 A1 * | 4/2016 | Tuers | G06F 11/1048 714/764 |
| 2017/0004039 A1 * | 1/2017 | Maffeis | G06F 11/1072 |
| 2017/0068591 A1 * | 3/2017 | Tate | G06F 11/1068 |

* cited by examiner $$\begin{array}{c} \overbrace{\begin{bmatrix} 0 & 0 & 1 & 0 & 1 & 0 & 0 & 1 & 1 \\ 1 & 0 & 0 & 0 & 1 & 0 & 1 & 0 & 0 \\ 0 & 1 & 0 & 1 & 0 & 0 & 0 & 1 & 0 \\ 0 & 1 & 0 & 0 & 1 & 0 & 0 & 1 & 0 \\ 1 & 0 & 0 & 1 & 0 & 0 & 1 & 0 & 1 \\ 0 & 0 & 1 & 1 & 0 & 1 & 0 & 0 & 1 \\ 0 & 1 & 0 & 0 & 0 & 1 & 1 & 0 & 0 \\ 1 & 0 & 1 & 0 & 0 & 1 & 0 & 0 & 0 \end{bmatrix}}^{n} \end{array}$$
k on left, ←700

DECODING METHOD, MEMORY STORAGE DEVICE AND MEMORY CONTROL CIRCUIT UNIT

CROSS-REFERENCE TO RELATED APPLICATION

This application claims the priority benefit of Taiwan application serial no. 105121218, filed on Jul. 5, 2016. The entirety of the above-mentioned patent application is hereby incorporated by reference herein and made a part of this specification.

BACKGROUND

Technology Field

The disclosure relates to a decoding technique, and in particular, a decoding method, a memory storage device, and a memory control circuit unit.

Description of Related Art

As digital cameras, mobile phones, and MP3 players have been growing rapidly in recent years, consumers' demand for storage media has also been growing significantly. With characteristics including data non-volatility, energy saving, small size, lack of mechanical structures, etc., rewritable non-volatile memory modules (e.g., flash memories) are ideal to be built-in in various portable multi-media devices such as those listed above.

In some memory devices, data are first coded and then stored. Later, when the data need to be read, the read data is decoded so as to correct errors therein. For example, the errors may include errors resulting from the memory module itself and/or from the channel noise generated during the transmission of data. Generally, the power consumption of a decoding circuit is negatively correlated with the decoding success rate. In other words, if the decoding circuit adopts a decoding algorithm having a higher decoding success rate and/or higher complexity, the power consumption for decoding of the decoding circuit is also higher. However, sometimes decoding may be completed with simple algorithms, such that power consumption may be saved. Therefore, how to achieve a balance between the power consumption and the decoding success rate of a decoding circuit is one of the issues that people skilled in the art strive to resolve.

Nothing herein should be construed as an admission of knowledge in the prior art of any portion of the present disclosure. Furthermore, citation or identification of any document in this application is not an admission that such document is available as prior art to the present disclosure, or that any reference forms a part of the common general knowledge in the art.

SUMMARY

The disclosure provides a decoding method, a memory storage device, and a memory control circuit unit, which are capable of achieving a balance between a power consumption and a decoding success rate of a decoding circuit.

An exemplary embodiment of the disclosure provides a decoding method adapted for a rewritable non-volatile memory module including a plurality of physical units. The decoding method includes: configuring a first message channel and a second message channel in an error checking and correcting circuit; reading a codeword from a first physical unit among the physical units and estimating error level information of the codeword; inputting the codeword to the error checking and correcting circuit through the first message channel and inputting the error level information of the codeword to the error checking and correcting circuit through the second message channel; determining whether the error level information of the codeword meets a default condition; inputting the codeword to a first decoding engine of the error checking and correcting circuit and decoding the codeword by the first decoding engine if the error level information of the codeword meets the default condition; and inputting the codeword to a second decoding engine of the error checking and correcting circuit and decoding the codeword by the second decoding engine if the error level information of the codeword does not meet the default condition, wherein a first power consumption of the first decoding engine for decoding the codeword is lower than a second power consumption of the second decoding engine for decoding the codeword.

Another exemplary embodiment of the disclosure provides a memory storage device which includes a connection interface unit, a rewritable non-volatile memory module, and a memory control circuit unit. The connection interface unit is configured to couple to a host system. The rewritable non-volatile memory module includes a plurality of physical units. The memory control circuit unit is coupled to the connection interface unit and the rewritable non-volatile memory module. The memory control circuit unit is configured to configure a first message channel and a second message channel in an error checking and correcting circuit of the memory control circuit unit. The memory control circuit unit is further configured to issue a read command sequence to instruct reading a codeword from a first physical unit among the physical units and estimate error level information of the codeword. The memory control circuit unit is further configured to input the codeword to the error checking and correcting circuit through the first message channel and input the error level information of the codeword to the error checking and correcting circuit through the second message channel. The memory control circuit unit is further configured to determine whether the error level information of the codeword meets a default condition. If the error level information of the codeword meets the default condition, the memory control circuit unit is further configured to input the codeword to a first decoding engine of the error checking and correcting circuit to decode the codeword by the first decoding engine. If the error level information of the codeword does not meet the default condition, the memory control circuit unit is further configured to input the codeword to a second decoding engine of the error checking and correcting circuit to decode the codeword by the second decoding engine, wherein a first power consumption of the first decoding engine for decoding the codeword is lower than a second power consumption of the second decoding engine for decoding the codeword.

Another exemplary embodiment of the disclosure provides a memory control circuit unit adapted to control a rewritable non-volatile memory module including a plurality of physical units. The memory control circuit unit includes a host interface, a memory interface, an error checking and correcting circuit, and a memory management circuit. The host interface is configured to couple to a host system. The memory interface is configured to couple to the rewritable non-volatile memory module. The error checking and correcting circuit includes a first decoding engine and a second decoding engine. The memory management circuit is coupled to the host interface, the memory interface, and the error checking and correcting circuit. The memory management circuit is configured to configure a first message channel and a second message channel in the error checking and correcting circuit. The memory management circuit is further configured to issue a read command sequence to instruct reading a codeword from a first physical unit among the physical units and estimate error level information of the codeword. The memory management circuit is further configured to input the codeword to the error checking and correcting circuit through the first message channel and input the error level information of the codeword to the error checking and correcting circuit through the second message channel. The error checking and correcting circuit is configured to determine whether the error level information of the codeword meets a default condition. If the error level information of the codeword meets the default condition, the error checking and correcting circuit is further configured to input the codeword to the first decoding engine and decode the codeword by the first decoding engine. If the error level information of the codeword does not meet the default condition, the error checking and correcting circuit is further configured to input the codeword to the second decoding engine and decode the codeword by the second decoding engine, wherein a first power consumption of the first decoding engine for decoding the codeword is lower than a second power consumption of the second decoding engine for decoding the codeword.

In light of the above, after the codeword to be decoded is obtained, the error level information of the codeword is estimated and served as reference in the decoding of the codeword by a decoding engine having a lower power consumption and a lower decoding success rate or by a decoding engine having a higher power consumption and a higher decoding success rate. Thereby, the disclosure may achieve a balance between the power consumption and the decoding success rate of the decoding circuit.

To provide a further understanding of the aforementioned and other features and advantages of the disclosure, exemplary embodiments, together with the reference drawings, are described in detail below.

It should be understood, however, that this Summary may not contain all of the aspects and embodiments of the present disclosure, is not meant to be limiting or restrictive in any manner, and that the disclosure as disclosed herein is and will be understood by those of ordinary skill in the art to encompass obvious improvements and modifications thereto.

DESCRIPTION OF THE EMBODIMENTS

Figure 1:
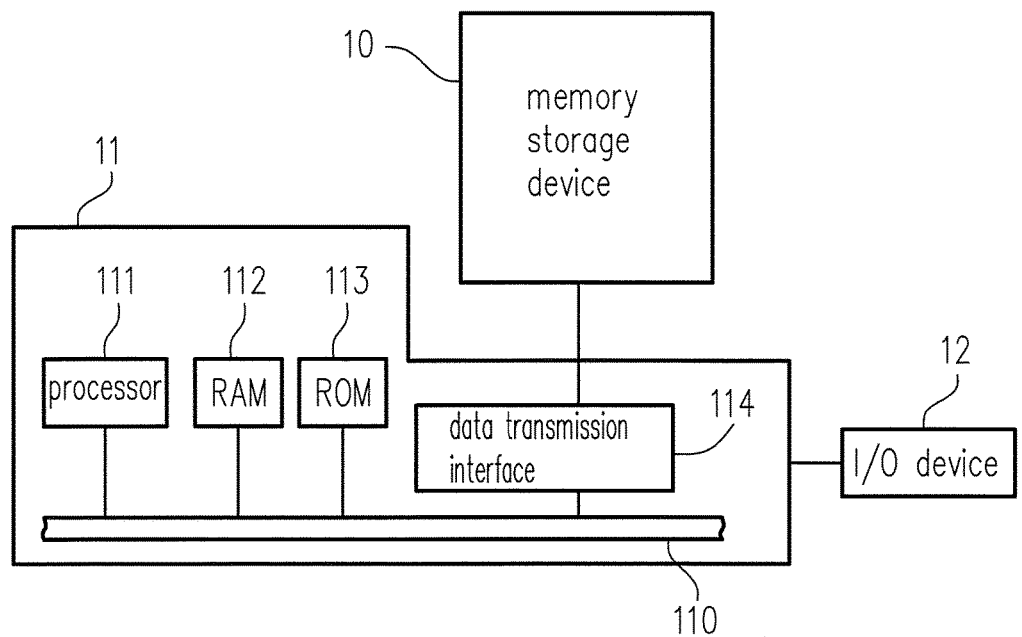
FIG. 1 is a schematic diagram illustrating a host system, a memory storage device, and an input/output (I/O) device according to one exemplary embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

Embodiments of the present disclosure may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Generally, a memory storage device (also referred to as a memory storage system) includes a rewritable non-volatile memory module and a controller (also referred to as a control circuit). The memory storage device is usually used together with a host system, such that the host system can write data to the memory storage device or read data from the memory storage device.

Figure 2:
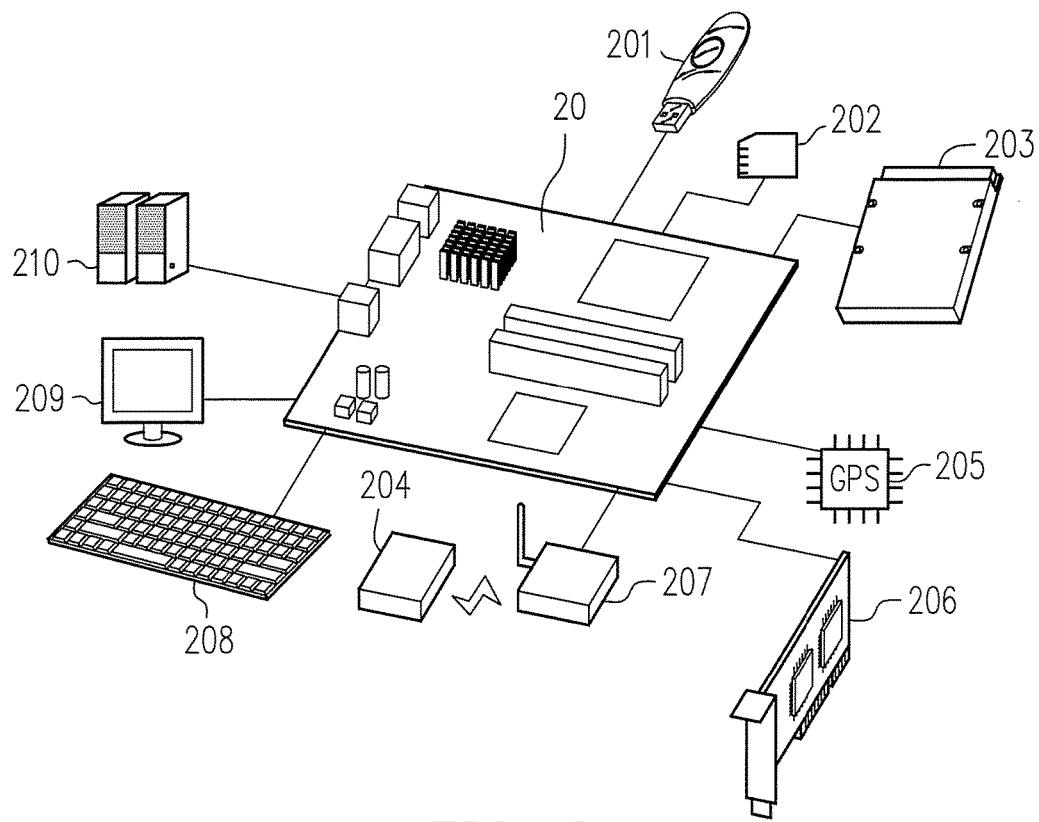
FIG. 2 is a schematic diagram illustrating a host system, a memory storage device, and an I/O device according to another exemplary embodiment of the disclosure.

FIG. 1 is a schematic diagram illustrating a host system, a memory storage device, and an input/output (I/O) device according to one exemplary embodiment of the disclosure. FIG. 2 is a schematic diagram illustrating a host system, a memory storage device, and an I/O device according to another exemplary embodiment of the disclosure.

Referring to FIG. 1 and FIG. 2, a host system 11 generally includes a processor 111, a random access memory (RAM) 112, a read only memory (ROM) 113, and a data transmission interface 114. The processor 111, the random access memory 112, the read only memory 113, and the data transmission interface 114 are all coupled to a system bus 110.

In the present exemplary embodiment, the host system 11 is coupled to a memory storage device 10 via the data transmission interface 114. For example, the host system 11 may store data to the memory storage device 10 or read data from the memory storage device 10 via the data transmission interface 114. Moreover, the host system 11 is coupled to the I/O device 12 via the system bus 110. For example, the host system 11 may transmit output signal to the I/O device 12 or receive input signal from the I/O device 12 via the system bus 110.

In the present exemplary embodiment, the processor 111, the random access memory 112, the read only memory 113, and the data transmission interface 114 may be installed on a motherboard 20 of the host system 11. The number of the data transmission interface 114 may be one or more. The motherboard 20 may be coupled to the memory storage device 10 via the data transmission interface 114 through wired or wireless manners. The memory storage device 10 is, for example, a flash drive 201, a memory card 202, a solid state drive (SSD) 203, or a wireless memory storage device 204. The wireless memory storage device 204 is a memory storage device based on various wireless communication technologies, such as a near field communication (NFC) memory storage device, a WiFi memory storage device, a Bluetooth memory storage device, or a low power Bluetooth memory storage device (e.g., iBeacon). Moreover, the motherboard 20 may also be coupled via the system bus 110 to various I/O devices, such as a global positioning system (GPS) module 205, a network interface card 206, a wireless transmission device 207, a keyboard 208, a screen 209, and a speaker 210. For example, in one exemplary embodiment, the motherboard 20 may access the wireless memory storage device 204 via the wireless transmission device 207.

Figure 3:
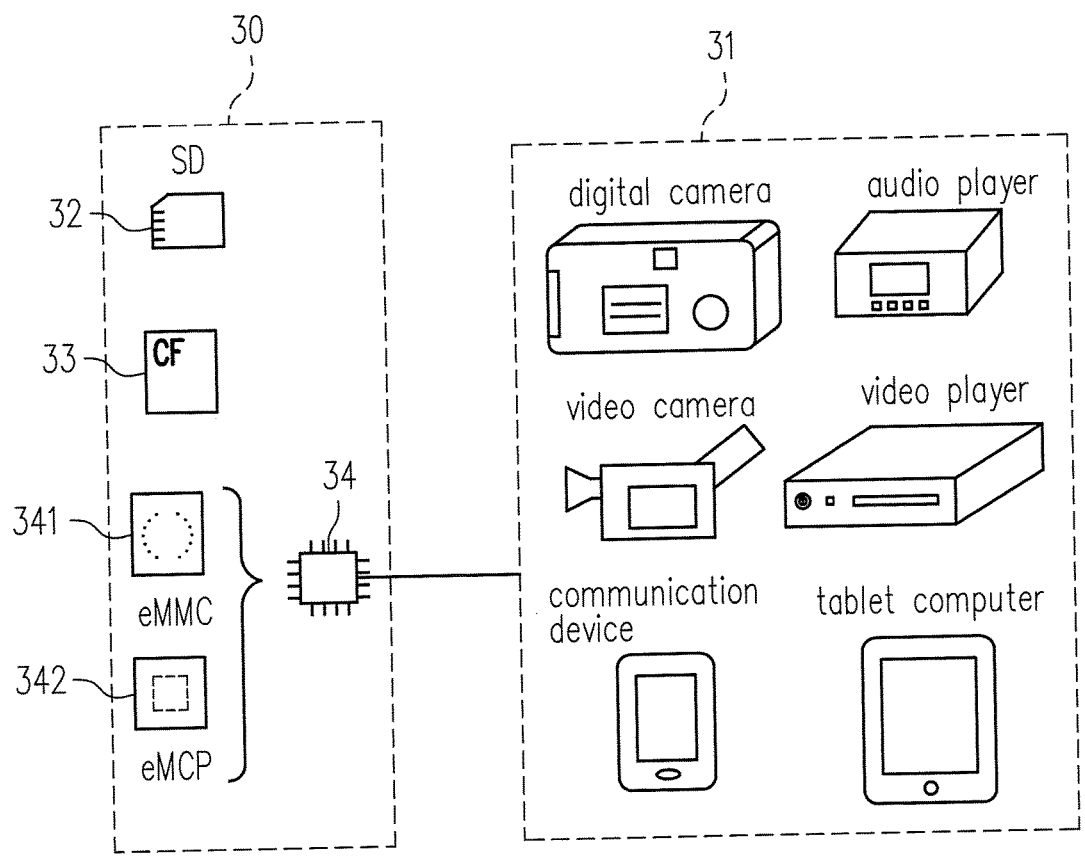
FIG. 3 is a schematic diagram illustrating a host system and a memory storage device according to another exemplary embodiment of the disclosure.

In one exemplary embodiment, the foregoing host system is any system that substantially works with the memory storage device to store data. In the exemplary embodiment above, the host system is illustrated with a computer system. However, FIG. 3 is a schematic diagram illustrating a host system and a memory storage device according to another exemplary embodiment of the disclosure. Referring to FIG. 3, in another exemplary embodiment, a host system 31 may also be a system such as a digital camera, a video camera, a communication device, an audio player, a video player, a tablet computer, etc. A memory storage device 30 is any one of various types of non-volatile memory storage devices used thereby, such as a secure digital (SD) card 32, a compact flash (CF) card 33, an embedded storage device 34, etc. The embedded storage device 34 is any of various types of embedded storage devices directly coupling a memory module to a substrate of the host system, such as an embedded multi media card (eMMC) 341 and/or an embedded multi chip package (eMCP) 342.

Figure 4:
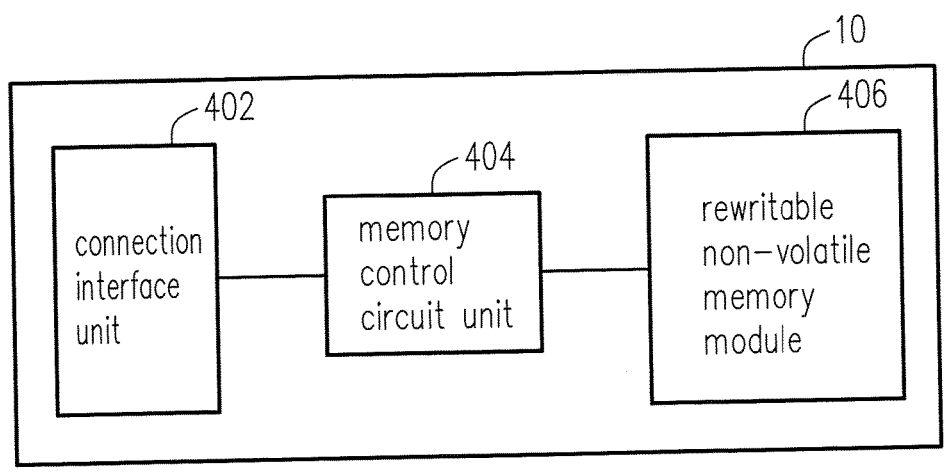
FIG. 4 is a schematic block diagram illustrating a memory storage device according to one exemplary embodiment of the disclosure.

FIG. 4 is a schematic block diagram illustrating a memory storage device according to one exemplary embodiment of the disclosure.

Referring to FIG. 4, the memory storage device 10 includes a connection interface unit 402, a memory control circuit unit 404, and a rewritable non-volatile memory module 406.

The connection interface unit 402 is configured to couple the memory storage device 10 to the host system 11. In the present exemplary embodiment, the connection interface unit 402 is compatible with the Serial Advanced Technology Attachment (SATA) standard. However, it is understood that the disclosure is not limited hereto. The connection interface unit 402 may also meet the Parallel Advanced Technology Attachment (PATA) standard, the Institute of Electrical and Electronic Engineers (IEEE) 1394 standard, the Peripheral Component Interconnect Express (PCI Express) standard, the Universal Serial Bus (USB) standard, the SD interface standard, the Ultra High Speed-I (UHS-I) interface standard, the Ultra High Speed-II (UHS-II) interface standard, the Memory Stick (MS) interface standard, the MCP interface standard, the MMC interface standard, the eMMC interface standard, the Universal Flash Storage (UFS) interface standard, the eMCP interface standard, the CF interface standard, the Integrated Device Electronics (IDE) standard, or other suitable standards. The connection interface unit 402 may be packaged with the memory control circuit unit 404 in one single chip, or the connection interface unit 402 is disposed outside a chip including the memory control circuit unit 404.

The memory control circuit unit 404 is configured to execute a plurality of logic gates or control commands implemented in a hardware form or a firmware form and perform operations, such as data writing, reading, erasing, etc., in the rewritable non-volatile memory module 406, according to commands of the host system 11.

The rewritable non-volatile memory module 406 is coupled to the memory control circuit unit 404 and is configured to store data written by the host system 11. The rewritable non-volatile memory module 406 may be a single level cell (SLC) NAND flash memory module (i.e., a flash memory module capable of storing 1 bit in one memory cell), a multi level cell (MLC) NAND flash memory module (i.e., a flash memory module capable of storing 2 bits in one memory cell), a triple level cell (TLC) NAND flash memory module (i.e., a flash memory module capable of storing 3 bits in one memory cell), another flash memory module, or any other memory modules with the same characteristics.

In the rewritable non-volatile memory module 406, one or more bits are stored by changing a voltage (hereinafter also referred to as a threshold voltage) of each of the memory cells. More specifically, in each of the memory cells, a charge trapping layer is provided between a control gate and a channel. An amount of electrons in the charge trapping layer may be changed by applying a write voltage to the control gate, thereby changing the threshold voltage of the memory cell. This operation of changing the threshold voltage is also known as "writing data to the memory cell" or "programming the memory cell". As the threshold voltage changes, each of the memory cells in the rewritable non-volatile memory module 406 has a plurality of storage states. The storage state to which a memory cell belongs may be determined by applying a read voltage, thereby obtaining the one or more bits stored in the memory cell.

Figure 5:
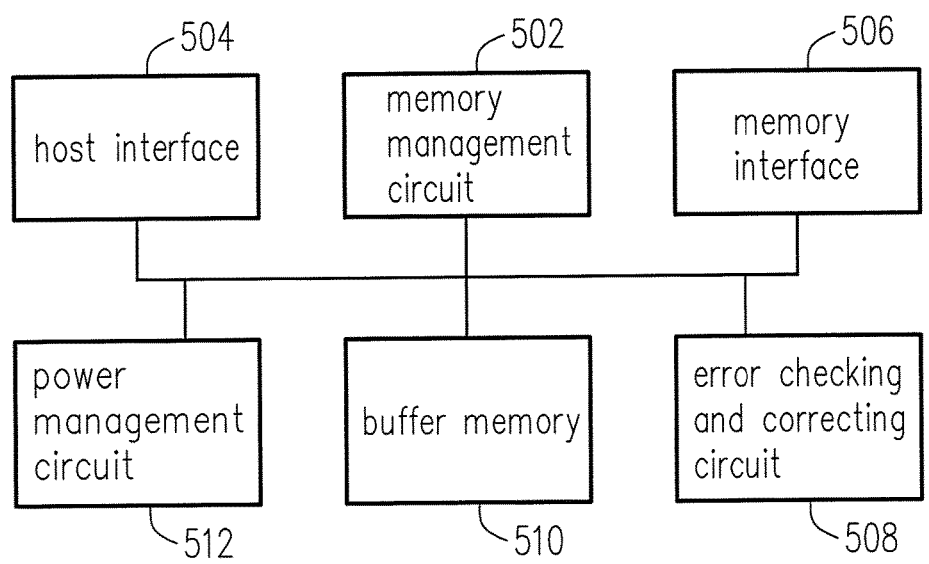
FIG. 5 is a schematic block diagram illustrating a memory control circuit unit according to one exemplary embodiment of the disclosure.

FIG. 5 is a schematic block diagram illustrating a memory control circuit unit according to one exemplary embodiment of the disclosure.

Referring to FIG. 5, the memory control circuit unit 404 includes a memory management circuit 502, a host interface 504, a memory interface 506, and an error checking and correcting circuit 508.

The memory management circuit 502 is configured to control overall operations of the memory control circuit unit 404. Specifically, the memory management circuit 502 has a plurality of control commands, and the control commands are executed to perform operations of data writing, reading, erasing, etc. when the memory storage device 10 is operating. Hereinafter, the description of operations of the memory management circuit 502 is regarded as equivalent to describing operations of the memory control circuit unit 404.

In the present exemplary embodiment, the control commands of the memory management circuit 502 are implemented in a firmware form. For example, the memory management circuit 502 includes a microprocessor unit (not illustrated) and a read only memory (not illustrated), wherein the control commands are burnt in the read only memory. When the memory storage device 10 is operating, the control commands are executed by the microprocessor unit to perform operations of data writing, reading, erasing, etc.

In another exemplary embodiment, the control commands of the memory management circuit 502 may also be stored as program codes in a specific area (for example, a system area in a memory module exclusively used for storing system data) of the rewritable non-volatile memory module 406. In addition, the memory management circuit 502 includes a microprocessor unit (not illustrated), a read only memory (not illustrated) and a random access memory (not illustrated). More particularly, the read only memory has a boot code, which is executed by the microprocessor unit to load the control commands stored in the rewritable non-volatile memory module 406 to the random access memory of the memory management circuit 502 when the memory control circuit unit 404 is enabled. Afterwards, the control commands are run by the microprocessor unit to perform operations of data writing, reading, erasing, etc.

Furthermore, in another exemplary embodiment, the control commands of the memory management circuit 502 may also be implemented in a hardware form. For example, the memory management circuit 502 includes a microprocessor, a memory cell management circuit, a memory writing circuit, a memory reading circuit, a memory erasing circuit, and a data processing circuit. The memory cell management circuit, the memory writing circuit, the memory reading circuit, the memory erasing circuit, and the data processing circuit are coupled to the microprocessor. The memory cell management circuit is configured to manage the memory cells of the rewritable non-volatile memory module 406 or a group thereof. The memory writing circuit is configured to issue a write command sequence for the rewritable non-volatile memory module 406 to write data to the rewritable non-volatile memory module 406. The memory reading circuit is configured to issue a read command sequence for the rewritable non-volatile memory module 406 to read data from the rewritable non-volatile memory module 406. The memory erasing circuit is configured to issue an erase command sequence for the rewritable non-volatile memory module 406 to erase data from the rewritable non-volatile memory module 406. The data processing circuit is configured to process the data to be written to the rewritable non-volatile memory module 406 and the data read from the rewritable non-volatile memory module 406. Each of the write command sequence, the read command sequence, and the erase command sequence may include one or more program codes or command codes for instructing the rewritable non-volatile memory module 406 to perform the corresponding operations, such as data writing, reading, and erasing. In one exemplary embodiment, the memory management circuit 502 may further issue command sequences of other types for the rewritable non-volatile memory module 406 to instruct performing corresponding operations.

The host interface 504 is coupled to the memory management circuit 502 and is configured to receive and identify commands and data transmitted by the host system 11. In other words, the commands and data transmitted by the host system 11 are transmitted to the memory management circuit 502 via the host interface 504. In the present exemplary embodiment, the host interface 504 is compatible with the SATA standard. However, it is understood that the disclosure is not limited hereto, and the host interface 504 may also be compatible with the PATA standard, the IEEE 1394 standard, the PCI Express standard, the USB standard, the SD standard, the UHS-I standard, the UHS-II standard, the MS standard, the MMC standard, the eMMC standard, the UFS standard, the CF standard, the IDE standard, or other suitable data transmission standards.

The memory interface 506 is coupled to the memory management circuit 502 and is configured to access the rewritable non-volatile memory module 406. In other words, data to be written to the rewritable non-volatile memory module 406 is converted into a format acceptable by the rewritable non-volatile memory module 406 through the memory interface 506. Specifically, if the memory management circuit 502 is to access the rewritable non-volatile memory module 406, the memory interface 506 transmits corresponding command sequences. For example, the command sequences may include the write command sequence for instructing writing data, the read command sequence for instructing reading data, the erase command sequence for instructing erasing data, and other corresponding command sequences for instructing performing various memory operations (e.g., changing a read voltage level or performing a garbage collection operation). These command sequences are generated by the memory management circuit 502 and are transmitted to the rewritable non-volatile memory module 406 through the memory interface 506, for example. The command sequences may include one or more signals, or data transmitted on the bus. The signals or the data may include command codes or program codes. For example, in a read command sequence, information such as identification codes and memory addresses are included.

The error checking and correcting circuit 508 is coupled to the memory management circuit 502 and is configured to perform an error checking and correcting operation to ensure the correctness of data. Specifically, when the memory management circuit 502 receives the write command from the host system 11, the error checking and correcting circuit 508 generates an error correcting code (ECC) and/or an error detecting code (EDC) for data corresponding to the write command, and the memory management circuit 502 writes the data corresponding to the write command and the corresponding error correcting code and/or error detecting code to the rewritable non-volatile memory module 406. Afterwards, when reading the data from the rewritable non-volatile memory module 406, the memory management circuit 502 simultaneously reads the error correcting code and/or the error detecting code corresponding to the data, and the error checking and correcting circuit 508 performs the error checking and correcting operation on the read data according to the error correcting code and/or the error detecting code.

In one exemplary embodiment, the memory control circuit unit 404 further includes a buffer memory 510 and a power management circuit 512.

The buffer memory 510 is coupled to the memory management circuit 502 and is configured to temporarily store data and commands from the host system 11 or data from the rewritable non-volatile memory module 406. The power management circuit 512 is coupled to the memory management circuit 502 and is configured to control a power of the memory storage device 10.

Figure 6:
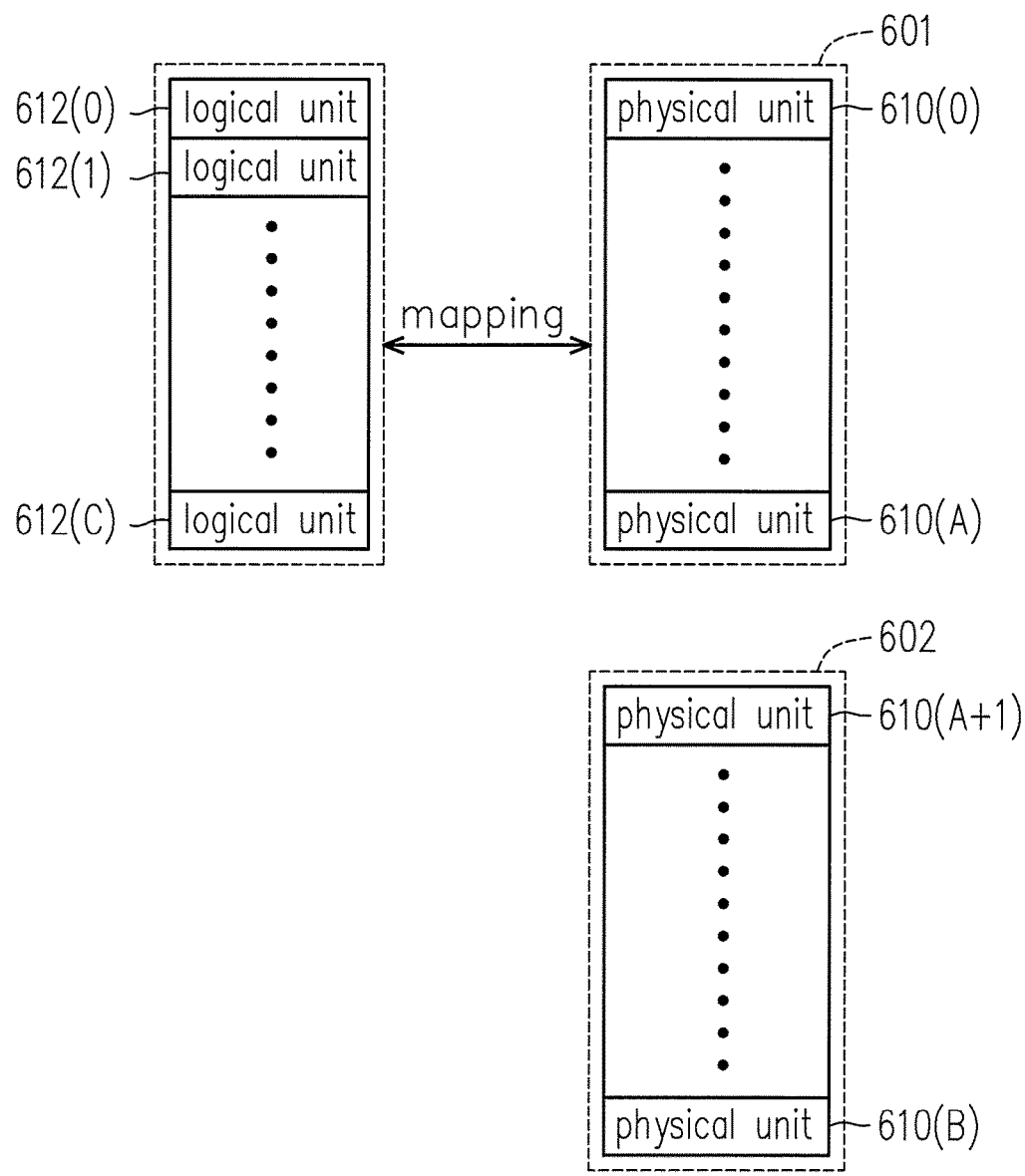
FIG. 6 is a schematic diagram illustrating management of a rewritable non-volatile memory module according to one exemplary embodiment of the disclosure.

FIG. 6 is a schematic diagram illustrating management of a rewritable non-volatile memory module according to one exemplary embodiment of the disclosure. It is understood that, regarding the operation of the physical units of the rewritable non-volatile memory module 406 in the exemplary embodiment below, terms such as "grouping" are logical concepts which describe operations performed on the physical units. In other words, the physical units of the rewritable non-volatile memory module 406 are logically operated, while actual positions of the physical units remain unchanged.

In the present exemplary embodiment, the memory cells of the rewritable non-volatile memory module 406 constitute a plurality of physical programming units, and the physical programming units constitute a plurality of physical erasing units. Specifically, the memory cells on the same word line constitute one or more of the physical programming units. If each of the memory cells can store two bits or more, the physical programming units on the same word line can be at least classified into a lower physical programming unit and an upper physical programming unit. For example, a least significant bit (LSB) of one memory cell belongs to the lower physical programming unit, and a most significant bit (MSB) of one memory cell belongs to the upper physical programming unit. Generally, in the MLC NAND flash memory, a writing speed of the lower physical programming unit is higher than a writing speed of the upper physical programming unit, and/or a reliability of the lower physical programming unit is higher than a reliability of the upper physical programming unit.

In the present exemplary embodiment, the physical programming unit is the minimal unit for programming. In other words, the physical programming unit is the minimal unit for writing data. For example, the physical programming unit is a physical page or a physical sector. When the physical programming unit is the physical page, the physical programming unit usually includes a data bit area and a redundancy bit area. The data bit area includes a plurality of physical sectors for storing user data, and the redundancy bit area is configured to store system data (e.g., an error correcting code). In the present exemplary embodiment, the data bit area includes 32 physical sectors, and a size of each physical sector is 512 bytes (B). However, in other exemplary embodiments, the data bit area may also include 8 or 16 physical sectors or physical sectors of a greater or smaller number, and the size of each physical sector may also be greater or smaller. On the other hand, the physical erasing unit is the minimal unit for erasing. Namely, each physical erasing unit contains the least number of memory cells to be erased altogether. For example, the physical erasing unit is a physical block.

Referring to FIG. 6, the memory management circuit 502 logically groups physical units 610(0) to 610(B) of the rewritable non-volatile memory module 406 into a storage area 601 and a replacement area 602. The physical units 610(0) to 610(A) in the storage area 601 are configured to store data, and the physical units 610(A+1) to 610(B) in the replacement area 602 are configured to replace damaged physical erasing units in the storage area 601. In the present exemplary embodiment, each of the physical units 610(0) to 610(B) refers to one or more physical erasing units. However, in another exemplary embodiment, each of the physical units 610(0) to 610(B) refers to one or more physical programming units or consists of memory cells of any number.

The memory management circuit 502 configures logical units 612(0) to 612(C) to map to the physical units 610(0) to 610(A) in the storage area 601. For example, in the present exemplary embodiment, the host system 11 accesses the data in the storage area 601 through a logical address (LA). Therefore, each of the logical units 612(0) to 612(C) refers to one logical address. However, in another exemplary embodiment, each of the logical units 612(0) to 612(C) may also refer to one logical programming unit or one logical erasing unit or consists of a plurality of consecutive or non-consecutive logical addresses. In addition, each of the logical units 612(0) to 612(C) may also be mapped to one or more physical units.

The memory management circuit 502 records a mapping relation (also known as a logical-physical mapping relation) between the logical units and the physical units into at least one logical-physical mapping table. When the host system 11 is to read the data from the memory storage device 10 or write the data to the memory storage device 10, the memory management circuit 502 may access the data in the memory storage device 10 according to the logical-physical mapping table.

In the present exemplary embodiment, the error checking and correcting circuit 508 supports a low-density parity-check (LDPC) code. For example, the error checking and correcting circuit 508 encodes and decodes based on the low-density parity-check code. In the low-density parity-check code, a valid codeword is defined by using a check matrix (also known as a parity-check matrix). Hereinafter, a parity-check matrix is marked as matrix H, and a codeword is marked as V. According to an equation (1) below, if a result calculated by multiplying the parity-check matrix H by the codeword V is a zero vector, it indicates that the codeword V is a valid codeword. Therein, an operator ⊗ represents a mod-2 matrix multiplication. In other words, a null space of the matrix H includes all valid codewords. However, the disclosure does not limit the content of the codeword V. For example, the codeword V may also include an error correcting code or an error detecting code generated by using any algorithm.

$$H \otimes V^T = 0 \quad (1)$$

In the equation (1), a dimension of the matrix H is k-by-n, and a dimension of the codeword V is 1-by-n, where k and n are both positive integers. The codeword V includes message bits and parity bits. For example, the codeword V may be represented by [U P], where a vector U is constituted by the message bits, and a vector P is constituted by the parity bits. A dimension of the vector U is 1-by-(n−k), and a dimension of the vector P is 1-by-k. In one exemplary embodiment, the message bits and the parity bits in a codeword are collectively referred to as data bits. For example, the codeword V includes n data bits, where a length of the message bits is (n−k) bits, and a length of the parity bits is k bits. Accordingly, a code rate of the codeword V is (n−k)/n.

Generally, a generation matrix (hereinafter marked as G) is used during encoding, so that an equation (2) below may be satisfied by any vector U, where a dimension of the generation matrix G is (n−k)-by-n.

$$U \otimes G = [U\ P] = V \quad (2)$$

The codeword V generated by the equation (2) is a valid codeword. Therefore, the equation (2) may be substituted into the equation (1) to obtain an equation (3) below.

$$H \otimes G^T \otimes U^T = 0 \quad (3)$$

Since the vector U may be any vector, an equation (4) below is definitely satisfied. In other words, after the parity-check matrix H is determined, the corresponding generation matrix G may also be determined.

$$H \otimes G^T = 0 \quad (4)$$

When a codeword V is decoded, a parity-check operation is first performed on the data bits in the codeword V. For example, the parity-check matrix H may be multiplied by the codeword V to generate a vector (hereinafter marked as S, as shown in an equation (5) below). If the vector S is a zero vector (i.e., each element in the vector S is zero), it indicates that decoding is successful and the codeword V may be directly output. If the vector S is not a zero vector (i.e., at least one element in the vector S is not zero), it indicates that at least one error exists in the codeword V and the codeword V is not a valid codeword.

$$H \otimes V^T = S \qquad (5)$$

In the equation (5), a dimension of the vector S is k-by-1, where each element in the vector S is also referred to as a syndrome. If the codeword V is not a valid codeword, the error checking and correcting circuit 508 performs a decoding operation in an attempt to correct the error in the codeword V.

Figures 7, 8:
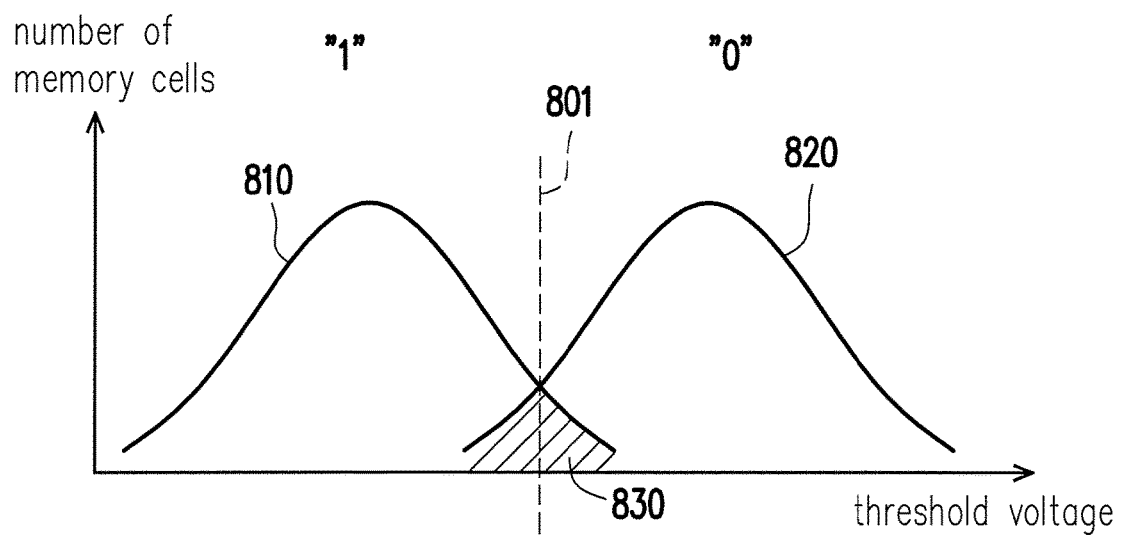
FIG. 7 is a schematic diagram illustrating a parity-check matrix according to one exemplary embodiment of the disclosure.
FIG. 8 is a schematic diagram illustrating a threshold voltage distribution of memory cells according to one exemplary embodiment of the disclosure.

FIG. 7 is a schematic diagram illustrating a parity-check matrix according to one exemplary embodiment of the disclosure.

Referring to FIG. 7, a dimension of a parity-check matrix 700 is k-by-n (for example, k is 8 and n is 9). However, the values of the positive integers k and n are not limited in the disclosure. Each row of the parity-check matrix 700 represents a constraint. Taking the first row of the parity-check matrix 700 for example, if a codeword is a valid codeword, the bit "0" is obtained after performing a mod-2 addition on the $3^{rd}$, $5^{th}$, $8^{th}$, and $9^{th}$ bits in the codeword. Persons of ordinary skill in the art is able to understand how to encode by using the parity-check matrix 700, which shall not be repeatedly described here. Additionally, the parity-check matrix 700 is merely an exemplary matrix. The parity-check matrix actually used may be adjusted according to the needs in practice. When the memory management circuit 502 is to store a plurality of bits to the rewritable non-volatile memory module 406, the error checking and correcting circuit 508 generates corresponding k parity bits for each (n–k) bits (i.e., the message bits) to be stored. Next, the memory management circuit 502 writes the n bits (i.e., the data bits) as a codeword to the rewritable non-volatile memory module 406.

FIG. 8 is a schematic diagram illustrating a threshold voltage distribution of memory cells according to one exemplary embodiment of the disclosure.

Referring to FIG. 8, a horizontal axis represents a threshold voltage of memory cells, and a vertical axis represents a number of the memory cells. For example, FIG. 8 illustrates the threshold voltage distribution of memory cells in one physical programming unit, where a state 810 corresponds to the bit "1" and a state 820 corresponds to the bit "0". If the threshold voltage of a memory cell falls in the state 810, it indicates that the bit "1" is stored in the memory cell. Conversely, if the threshold voltage of a memory cell falls in the state 820, it indicates that the bit "0" is stored in the memory cell. It is mentioned that, in the present exemplary embodiment, one state in the threshold voltage distribution corresponds to one bit value (i.e., "1" or "0"), and there are two possible states (i.e., states 810 and 820) for the threshold voltage distribution of the memory cells. However, in other exemplary embodiments, each state in the threshold voltage distribution may correspond to multiple bit values (e.g., "00", "010", etc.), and there may be four, eight, or any number of possible states for the threshold voltage distribution of the memory cells. In addition, the bit represented by each state is not particularly limited in the disclosure. For example, in another exemplary embodiment of FIG. 8, the state 810 may also correspond to the bit "0", and the state 820 may correspond to the bit "1".

In the present exemplary embodiment, when data is to be read from the rewritable non-volatile memory module 406, the memory management circuit 502 sends a read command sequence to the rewritable non-volatile memory module 406 to instruct the rewritable non-volatile memory module 406 to read data from a physical unit (hereinafter also referred to as a first physical unit). For example, according to the read command sequence, the rewritable non-volatile memory module 406 reads the memory cells in the first physical unit by using a read voltage 801 in FIG. 8. If a memory cell has a threshold voltage lower than the read voltage 801, the memory cell is turned on, and the bit "1" is read by the memory management circuit 502. Conversely, if a memory cell has a threshold voltage greater than the read voltage 801, the memory cell is not turned on, and the bit "0" is read by the memory management circuit 502.

In the present exemplary embodiment, an overlap region 830 is included between the state 810 and the state 820. The area of the overlap region 830 is positively correlated with a total number of the memory cells each having the threshold voltage falls in the overlap region 830. For example, the overlap region 830 indicates that a memory cell should store the bit "1" (belonging to the state 810), but the threshold voltage thereof is higher than the applied read voltage 801, and a memory cell should store the bit "0" (belonging to the state 820), but the threshold voltage thereof is lower than the applied read voltage 801. In other words, part of the bits among the data read by applying the read voltage 801 are erroneous. Particularly, as the time of use of the memory storage device 10 cumulates, the area of the overlap region 830 will gradually expand, and the read data may contain more and more errors.

In the present exemplary embodiment, after receiving the read data from the rewritable non-volatile memory module 406, the memory management circuit 502 performs a parity-check operation to verify if any error exists in the data. If it is determined that an error exists in the data, the error checking and correcting circuit 508 performs a decoding operation to decode the data in an attempt to correct the error in the data. For example, the parity-check operation and the decoding operation are both performed based on the unit of a codeword. In addition, the error checking and correcting circuit 508 may support at least two decoding algorithms among common decoding algorithms for the low-density parity-check code, including a bit flipping algorithm, a gradient descent bit flipping algorithm, a min sum algorithm, and a sum product algorithm.

Figure 9:
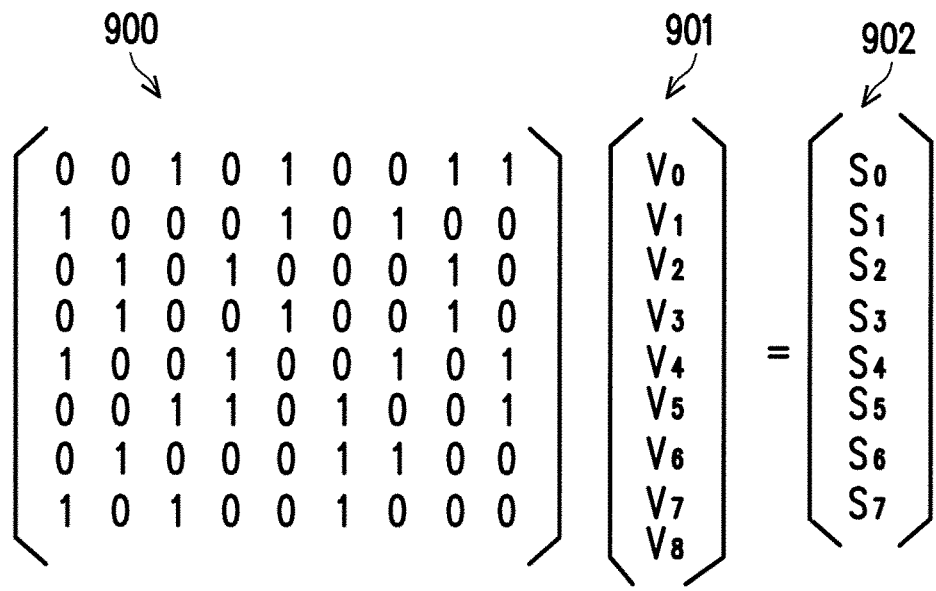
FIG. 9 is a schematic diagram illustrating a parity-check operation according to one exemplary embodiment of the disclosure.

FIG. 9 is a schematic diagram illustrating a parity-check operation according to one exemplary embodiment of the disclosure.

Referring to FIG. 9, if the data read from the first physical unit includes a codeword 901, in the parity-check operation, according to the equation (5), a parity-check matrix 900 is multiplied by the codeword 901 to obtain a syndrome vector 902 (i.e., vector S), where each bit in the codeword 901 corresponds to at least one element (i.e., syndrome) in the syndrome vector 902. For example, the bit $V_0$ in the codeword 901 (corresponding to the first column in the parity-check matrix 900) corresponds to syndromes $S_1$, $S_4$, and $S_7$; the bit $V_1$ (corresponding to the second column in the parity-check matrix 900) corresponds to syndromes $S_2$, $S_3$, and $S_6$, and so on. If the bit $V_0$ is an error bit, at least one of the syndromes $S_1$, $S_4$, and $S_7$ may be "1". If the bit $V_1$ is an error bit, at least one of the syndromes $S_2$, $S_3$, and $S_6$ may be "1", and so on. If the syndromes $S_0$ to $S_7$ are all "0", it indicates that there is a high probability that the codeword 901 contains no error bit. Accordingly, the error checking and correcting circuit 508 may directly output the codeword 901. However, if the codeword 901 contains at least one error bit (namely, at least one of the syndromes $S_0$ to $S_7$ may be "1"), the error checking and correcting circuit 508 decodes the codeword 901 in an attempt to correct the error in the codeword 901.

Figure 10:
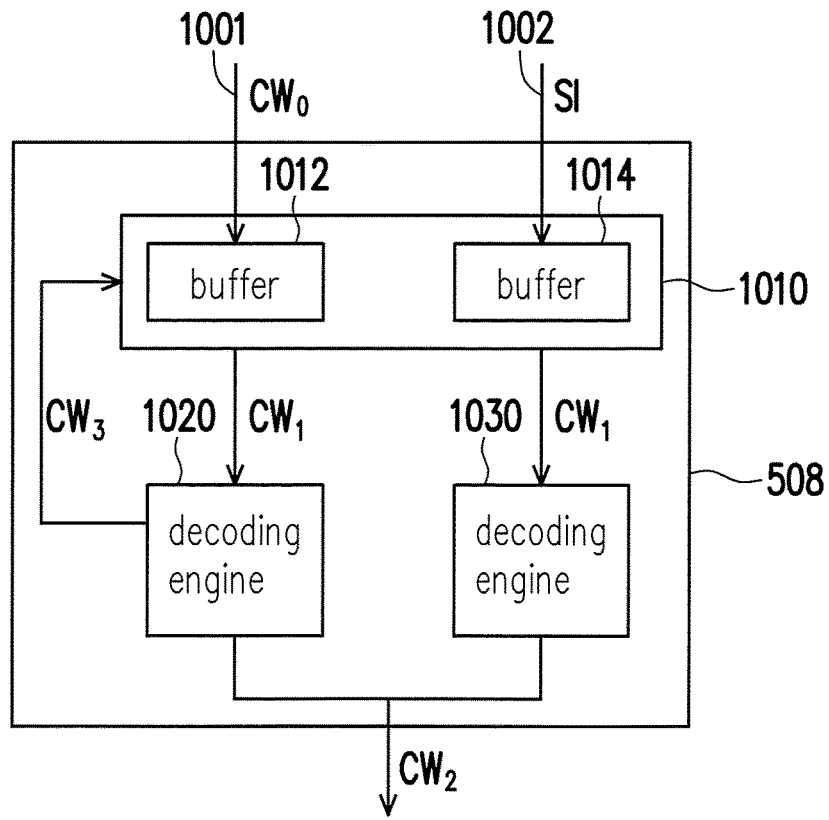
FIG. 10 is a schematic diagram illustrating an error checking and correcting circuit according to one exemplary embodiment of the disclosure.

FIG. 10 is a schematic diagram illustrating an error checking and correcting circuit according to one exemplary embodiment of the disclosure.

Referring to FIG. 10, the error checking and correcting circuit 508 includes a decision circuit 1010, a decoding engine 1020 (hereinafter also referred to as a first decoding engine) and a decoding engine 1030 (hereinafter also referred to as a second decoding engine). The memory management circuit 502 configures a message channel 1001 (hereinafter also referred to as a first message channel) and a message channel 1002 (hereinafter also referred to as a second message channel) in the error checking and correcting circuit 508. For example, the message channel 1001 and the message channel 1002 may be physical circuit channels independent from each other or virtual bypass channels. After a codeword $CW_0$ to be decoded is obtained, the memory management circuit 502 estimates error level information SI of the codeword $CW_0$. For example, the error level information SI may be quantitative information in any form and a value of the error level information SI is positively correlated with a total number of error bits that may be contained in the codeword $CW_0$. The memory management circuit 502 inputs the codeword $CW_0$ to the error checking and correcting circuit 508 through the message channel 1001 and inputs the error level information SI to the error checking and correcting circuit 508 through the message channel 1002. For example, through the message channel 1001, the codeword $CW_0$ is temporarily stored in a buffer 1012 of the decision circuit 1010, and through the message channel 1002, the error level info illation SI is temporarily stored in a buffer 1014 of the decision circuit 1010.

The decision circuit 1010 further includes at least one processing circuit (not illustrated). After the error level information SI is obtained, the decision circuit 1010 determines whether the error level information SI meets a default condition. If the error level information SI meets the default condition, the decision circuit 1010 inputs a codeword $CW_1$ to the decoding engine 1020 such that the codeword $CW_1$ is decoded by the decoding engine 1020, wherein the codeword $CW_1$ is identical to the codeword $CW_0$. However, if the error level information SI does not meet the default condition, the decision circuit 1010 inputs the codeword $CW_1$ to the decoding engine 1030 such that the codeword $CW_1$ is decoded by the decoding engine 1030. After the codeword $CW_1$ is decoded by the decoding engine 1020 or the decoding engine 1030, if the performed decoding operation is successful (namely, all errors in the codeword $CW_1$ are corrected), a codeword $CW_2$ is output.

It is noted that a decoding performance of the decoding engine 1020 is lower than a decoding performance of the decoding engine 1030. For example, the complexity of a decoding algorithm and/or a circuit structure adopted by the decoding engine 1020 is lower than the complexity of a decoding algorithm and/or a circuit structure adopted by the decoding engine 1030. Accordingly, a power consumption (hereinafter also referred to as a first power consumption) of the decoding engine 1020 for decoding the codeword $CW_1$ is lower than a power consumption (hereinafter also referred to as a second power consumption) of the decoding engine 1030 for decoding the codeword $CW_1$. Moreover, if the codeword $CW_1$ contains more error bits, a decoding success rate (hereinafter also referred to as a first decoding success rate) of the decoding engine 1020 decoding the codeword $CW_1$ is lower than a decoding success rate (hereinafter also referred to as a second decoding success rate) of the decoding engine 1030 decoding the codeword $CW_1$. Alternatively, from another perspective, the decoding performance of the decoding engine 1020 being lower than the decoding performance of the decoding engine 1030 may also mean that with respect to the same codeword, a total number of error bits that can be corrected by the decoding engine 1020 is less than a total number of error bits that can be corrected by decoding engine 1030.

In other words, according to the error level information SI, the decision circuit 1010 can roughly estimate whether the error bits contained in the codeword $CW_0$ are more or less. If there is a higher probability that the error bits contained in the codeword $CW_0$ are less, the decision circuit 1010 instructs the codeword $CW_1$ to be decoded by the decoding engine 1020, thereby saving the power consumption for performing the decoding operation without greatly lowering the decoding success rate. Conversely, if there is a higher probability that the error bits contained in the codeword $CW_0$ are more, the decision circuit 1010 instructs the codeword $CW_1$ to be decoded by the decoding engine 1030, thereby ensuring that the codeword $CW_1$ can be successfully decoded.

In the present exemplary embodiment, the error level information SI of the codeword $CW_0$ includes at least one of a bit error rate of the codeword $CW_0$, a channel noise intensity of a transmission medium for transmitting the codeword $CW_0$, a programming count of the first physical unit, a reading count of the first physical unit, an erasing count of the first physical unit, and a syndrome sum of the codeword $CW_0$. The bit error rate of the codeword $CW_0$ refers to a proportion of error bits in the codeword $CW_0$ (or a proportion of error bits in each codeword read from the first physical unit). The channel noise intensity of a transmission medium for transmitting the codeword $CW_0$ refers to a channel noise intensity of a transmission channel between the memory control circuit unit 404 and the rewritable non-volatile memory module 406. The programming count of the first physical unit refer to the times for which the first physical unit is programmed. The reading count of the first physical unit refer to the times for which the first physical unit is read. The erasing count of the first physical unit refer to the times for which the first physical unit is erased. The foregoing types of the error level information SI can all be obtained by referring to table(s). Moreover, regarding the syndrome sum of the codeword $CW_0$, the memory management circuit 502 performs a parity-check operation such as the equation (5) on the codeword $CW_0$ to obtain a plurality of syndromes of the codeword $CW_0$, and the syndromes are accumulated to obtain the syndrome sum of the codeword $CW_0$. For example, in FIG. 9, if the codeword 901 is the codeword $CW_0$, by accumulating the syndromes $S_0$ to $S_7$, the syndrome sum of the codeword $CW_0$ is obtained. For example, if P syndromes among the syndromes $S_0$ to $S_7$ are "1", the syndrome sum of the codeword $CW_0$ is "P".

Corresponding to different types of the error level information SI, the decision circuit 1010 performs a corresponding decision to determine whether the error level information SI of the codeword $CW_0$ meets the default condition. For example, the decision circuit 1010 may determine whether the obtained bit error rate is lower than a default bit error rate, whether the obtained channel noise intensity is lower than a default channel noise intensity, whether the obtained programming count is less than a default programming count, whether the obtained reading count is less than a default reading count, whether the obtained erasing count is less than a default erasing count, and/or whether the obtained syndrome sum is lower than a default syndrome sum.

In one exemplary embodiment, as long as any one of the conditions in the foregoing determination is met (e.g., the obtained bit error rate is lower than the default bit error rate, the obtained channel noise intensity is lower than the default channel noise intensity, the obtained programming count is less than the default programming count, the obtained reading count is less than the default reading count, the obtained erasing count is less than the default erasing count, or the obtained syndrome sum is lower than the default syndrome sum), the decision circuit 1010 determines that the error level information SI of the codeword $CW_0$ meets the default condition and inputs the codeword $CW_1$ to the decoding engine 1020. The reason lies in that if any one of the conditions in the foregoing determination is met, there is a high probability that the total number of the error bits contained in the codeword $CW_0$ (or in the codeword $CW_1$) is not more. Therefore, using the decoding engine 1020 to perform the decoding operation is relatively power-saving and does not have much influence on the decoding performance. Conversely, if none of the conditions in the foregoing determination is met (e.g., the obtained bit error rate is not lower than the default bit error rate, the obtained channel noise intensity is not lower than the default channel noise intensity, the obtained programming count is not less than the default programming count, the obtained reading count is not less than the default reading count, the obtained erasing count is not less than the default erasing count, or the obtained syndrome sum is not lower than the default syndrome sum), the decision circuit 1010 determines that the error level information SI of the codeword $CW_0$ does not meet the default condition and inputs the codeword $CW_1$ to the decoding engine 1030. The reason lies in that if none of the conditions in the foregoing determination is met, there is a high probability that the total number of the error bits contained in the codeword $CW_0$ (or in the codeword $CW_1$) is more. Therefore, directly using the decoding engine 1030 to perform the decoding operation is more efficient.

In another exemplary embodiment, (only) when a plurality of the conditions in the foregoing determination are met (e.g., the obtained bit error rate is lower than the default bit error rate and the obtained syndrome sum is lower than the default syndrome sum), the decision circuit 1010 determines that the error level information SI of the codeword $CW_0$ meets the default condition and inputs the codeword $CW_1$ to the decoding engine 1020. It is noted that compared to the operation where the decoding engine 1020 is used to decode the codeword $CW_1$ once any one of the determination conditions above is met, although the use rate of the decoding engine 1020 is decreased (or the use rate of the decoding engine 1030 is increased) and thereby increasing the overall power consumption of the error checking and correcting circuit 508 by limiting the use of the decoding engine 1020 based on whether a plurality of the determination conditions are met, the decoding performance and/or decoding stability of the error checking and correcting circuit 508 is relatively enhanced because the decoding engine 1030 has more powerful decoding capacity.

In one exemplary embodiment, a remaining power of a battery of the memory storage device 10 may also serve as reference for selecting the decoding engine 1020 or the decoding engine 1030. For example, if a battery power (i.e., the remaining power of the battery of the memory storage device 10) supplied to the error checking and correcting circuit 508 is lower than a default power value and the battery power is not coupled to an external power charging source, the decision circuit 1010 may directly input the codeword $CW_1$ to the decoding engine 1020 such that the codeword $CW_1$ can be decoded by the decoding engine 1020. In this case, the foregoing operation for determining whether the error level information SI of the codeword $CW_0$ meets the default condition is skipped. Conversely, if the remaining power of the battery of the memory storage device 10 is higher than the default power value, or if the remaining power of the battery of the memory storage device 10 is lower than the default power but the memory storage device 10 is coupled to the external power charging source (i.e., the memory storage device 10 is charged with external power), the foregoing operation for determining whether the error level information SI of the codeword $CW_0$ meets the default condition can be subsequently performed.

In one exemplary embodiment, after the decoding engine 1020 is used to decode the codeword $CW_1$, if the decoding engine 1020 does not correct all the errors in the codeword $CW_1$ (namely, the decoding operation performed by the decoding engine 1020 fails), the codeword $CW_0$ or a decoding result of the decoding engine 1020 (i.e., a codeword $CW_3$ output by the decoding engine 1020) is input as the codeword $CW_1$ to be decoded to the decoding engine 1030 in an attempt to use the decoding engine 1030 having more powerful decoding capacity to decode the initial codeword $CW_0$ again or further decode the codeword $CW_3$ based on the decoding result of the decoding engine 1020. For example, compared with the initial codeword $CW_0$, a total number of the error bits contained in the codeword $CW_3$ may be decreased. Therefore, a decoding success rate and/or a decoding speed of the decoding engine 1030 for decoding the codeword $CW_3$ may be higher and/or faster than that of directly decoding the codeword $CW_0$.

Table 1 below presents some exemplary combinations of the decoding algorithms adopted by the decoding engine 1020 and the decoding engine 1030 in a plurality of exemplary embodiments. It is noted that in some unmentioned exemplary embodiments, any combinations of the decoding algorithms that meet the foregoing characteristics of the decoding engine 1020 and the decoding engine 1030 may also be adopted, and the disclosure is not limited hereto.

TABLE 1

| decoding engine 1020 | decoding engine 1030 |
|---|---|
| bit flipping algorithm | gradient descent bit flipping algorithm |
| bit flipping algorithm | min sum algorithm |
| bit flipping algorithm | sum product algorithm |
| gradient descent bit flipping algorithm | min sum algorithm |
| gradient descent bit flipping algorithm | sum product algorithm |
| min sum algorithm | sum product algorithm |

According to Table 1, in one exemplary embodiment, if the decoding engine 1020 performs a decoding operation of a low-density parity-check code (hereinafter also referred to as a first decoding operation) based on the bit flipping algorithm, the decoding engine 1030 performs another decoding operation of the low-density parity-check code (hereinafter also referred to as a second decoding operation) based on, for example, the gradient descent bit flipping algorithm, the min sum algorithm, or the sum product algorithm. In another exemplary embodiment, if the decoding engine 1020 performs the first decoding operation of the low-density parity-check code based on the gradient descent bit flipping algorithm, the decoding engine 1030 performs the second decoding operation of the low-density parity-check code based on, for example, the min sum algorithm or the sum product algorithm. Alternatively, in still another exemplary embodiment, if the decoding engine 1020 performs the first decoding operation of the low-density parity-check code based on the min sum algorithm, the decoding engine 1030 performs the second decoding operation of the low-density parity-check code based on, for example, the sum product algorithm. People of ordinary skill in the art shall be able to understand how to perform corresponding decoding operations based on each of the decoding algorithms and which hardware circuit structures support specific decoding algorithms, which shall not be repeatedly described here.

In one exemplary embodiment, the first decoding operation performed by the decoding engine 1020 and the second decoding operation performed by the decoding engine 1030 are both hard bit mode decoding. For example, in hard bit mode decoding, each bit in the codeword $CW_0$ is obtained by reading a memory cell based on one single hard decision voltage. In another exemplary embodiment, the first decoding operation performed by the decoding engine 1020 and/or the second decoding operation performed by the decoding engine 1030 may also be soft bit mode decoding. For example, in soft bit mode decoding, at least one bit in the codeword $CW_0$ is obtained by reading one single memory cell based on a plurality of soft decision voltages, such that the codeword $CW_0$ contains more decoding information. Generally, the decoding success rate of the soft bit mode decoding is higher than the decoding success rate of the hard bit mode decoding.

In addition, in one exemplary embodiment, the first decoding operation performed by the decoding engine 1020 and/or the second decoding operation performed by the decoding engine 1030 may also switch between the hard bit mode decoding and the soft bit mode decoding. For example, in one exemplary embodiment, the first decoding operation performed by the decoding engine 1020 and/or the second decoding operation performed by the decoding engine 1030 both adopt the hard bit mode decoding by default, but after decoding of the decoding engine 1020 fails, the decoding engine 1030 automatically switches to the soft bit mode decoding to continue to perform the decoding operation. Accordingly, an operating flexibility of the error checking and correcting circuit can be further enhanced.

Figure 11:
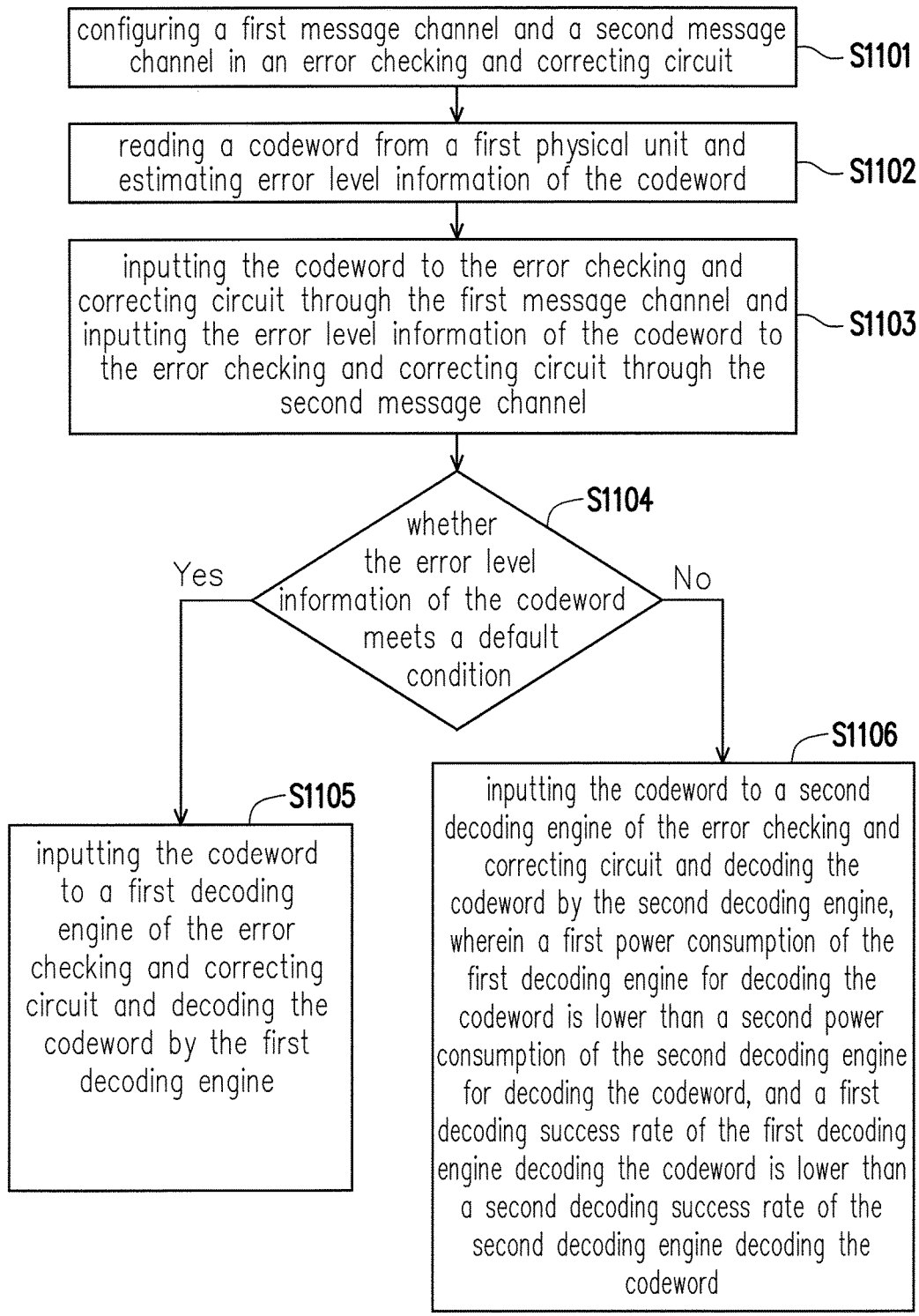
FIG. 11 is a flowchart illustrating a decoding method according to one exemplary embodiment of the disclosure.

FIG. 11 is a flowchart illustrating a decoding method according to one exemplary embodiment of the disclosure.

Referring to FIG. 11, in step S1101, a first message channel and a second message channel are configured in an error checking and correcting circuit. In step S1102, a codeword is read from a first physical unit and error level information of the codeword is estimated. In step S1103, the codeword is input to the error checking and correcting circuit through the first message channel, and the error level information of the codeword is input to the error checking and correcting circuit through the second message channel. In step S1104, whether the error level information of the codeword meets a default condition is determined. If the error level information of the codeword meets the default condition, in step S1105, the codeword is input to a first decoding engine of the error checking and correcting circuit and the codeword is then decoded by the first decoding engine. If the error level information of the codeword does not meet the default condition, in step S1106, the codeword is input to a second decoding engine of the error checking and correcting circuit and the codeword is then decoded by the second decoding engine, wherein a first power consumption of the first decoding engine for decoding the codeword is lower than a second power consumption of the second decoding engine for decoding the codeword. In one exemplary embodiment, a first decoding success rate of the first decoding engine decoding the codeword is lower than a second decoding success rate of the second decoding engine decoding the codeword.

However, each of the steps in FIG. 11 has been detailed above and shall not be repeatedly described here. It is noted that each of the steps in FIG. 11 may be implemented in a plurality of program codes or circuits, which shall not be limited in the disclosure. In addition, the method of FIG. 11 may operate with the foregoing exemplary embodiments or operate on its own, which shall not be limited in the disclosure.

In summary of the above, after the codeword to be decoded is obtained, the error level information of the codeword is estimated and served as reference in the decoding of the codeword by the decoding engine having a lower power consumption and a lower decoding success rate or by another decoding engine having a higher power consumption and a higher decoding success rate. Thereby, the disclosure achieves a balance between the power consumption and the decoding success rate of the decoding circuit.

The previously described exemplary embodiments of the present disclosure have the advantages aforementioned, wherein the advantages aforementioned not required in all versions of the disclosure.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A decoding method adapted for a rewritable nonvolatile memory module comprising a plurality of physical units, the decoding method comprising:

configuring a first message channel and a second message channel in an error checking and correcting circuit which comprises a first decoding engine and a second decoding engine;

reading a first codeword from a first physical unit among the physical units;

performing a first parity-check operation on the first codeword to obtain a plurality of first syndromes of the first codeword before the first codeword is decoded;

accumulating the first syndromes to obtain a first syndrome sum;

decoding the first codeword by the first decoding engine in response to that the first syndrome sum is lower than a default syndrome sum;

reading a second codeword from a second physical unit among the physical units;

performing a second parity-check operation on the second codeword to obtain a plurality of second syndromes of the second codeword before the second codeword is decoded;

accumulating the second syndromes to obtain a second syndrome sum;

decoding the second codeword by the second decoding engine in response to that the second syndrome sum is not lower than the default syndrome sum, wherein a first power consumption of the first decoding engine for decoding the first codeword is lower than a second power consumption of the second decoding engine for decoding the second codeword;

reading a third codeword from a third physical unit among the physical units;

estimating error level information of the third codeword, wherein the error level information comprises at least one of a programming count of the third physical unit, a reading count of the third physical unit, an erasing count of the third physical unit, a third syndrome sum of the third codeword, a bit error rate of the third codeword, and a channel noise intensity of a transmission medium for transmitting the third codeword;

determining whether the error level information of the third codeword meets a default condition;

decoding the third codeword by the first decoding engine in response to that the error level information of the third codeword meets the default condition; and decoding the third codeword by the second decoding engine in response to that the error level information of the third codeword does not meet the default condition.

2. The decoding method according to claim 1, wherein the step of determining whether the error level information of the third codeword meets the default condition comprises:

determining that the error level information of the third codeword meets the default condition if one of the following conditions is met: the hit error rate is lower than a default bit error rate, the channel noise intensity is lower than a default channel noise intensity, the programming count is less than a default programming count, the reading count is less than a default reading count, the erasing count is less than a default erasing count, and the third syndrome sum is lower than the default syndrome sum.

3. The decoding method according to claim 1, wherein the step of determining whether the error level information of the third codeword meets the default condition comprises:

determining that the error level information of the third codeword meets the default condition if a plurality of the following conditions are met: the bit error rate is lower than a default bit error rate, the channel noise intensity is lower than a default channel noise intensity, the programming count is less than a default programming count, the reading count is less than a default reading count, the erasing count is less than a default erasing count, and the third syndrome sum is lower than the default syndrome sum.

4. The decoding method according to claim 1, wherein the step of estimating the error level information of the third codeword comprises:

performing a third parity-check operation on the third codeword to obtain a plurality of third syndromes of the third codeword; and accumulating the third syndromes to obtain the third syndrome sum.

5. The decoding method according to claim 1, further comprising:

reading a fourth codeword from a fourth physical unit among the physical units;

inputting directly the fourth codeword to the first decoding engine and decoding the fourth codeword by the first decoding engine if a battery power supplied to the error checking and correcting circuit is lower than a default power value and the battery power is not coupled to an external power charging source.

6. The decoding method according to claim 1, further comprising:

inputting the first codeword or a decoding result of the first decoding engine to the second decoding engine if the first decoding engine does not correct all errors in the first codeword.

7. The decoding method according to claim 1, wherein the second decoding engine performs a second decoding operation of a low-density parity-check code based on a gradient descent bit flipping algorithm, a min sum algorithm, or a sum product algorithm if the first decoding engine performs a first decoding operation of the low-density parity-check code based on a bit flipping algorithm, wherein the second decoding engine performs the second decoding operation of the low-density parity-check code based on the min sum algorithm or the sum product algorithm if the first decoding engine performs the first decoding operation of the low-density parity-check code based on the gradient descent bit flipping algorithm, wherein the second decoding engine performs the second decoding operation of the low-density parity-check code based on the sum product algorithm if the first decoding engine performs the first decoding operation of the low-density parity-check code based on the min sum algorithm.

8. A memory storage device comprising:

a connection interface unit configured to couple to a host system;

a rewritable non-volatile memory module comprising a plurality of physical units; and a memory control circuit unit coupled to the connection interface unit and the rewritable non-volatile memory module, wherein an error checking and correcting circuit of the memory control circuit unit comprises a first decoding engine and a second decoding engine, wherein the memory control circuit unit is configured to issue a first read command sequence to instruct reading a first codeword from a first physical unit among the physical units, wherein the memory control circuit unit is further configured to perform a first parity-check operation on the first codeword to obtain a plurality of first syndromes of the first codeword before the first codeword is decoded, wherein the memory control circuit unit is further configured to accumulate the first syndromes to obtain a first syndrome sum, wherein the error checking and correcting circuit is configured to decode the first codeword by the first decoding engine in response to that the first syndrome sum is lower than a default syndrome sum, wherein the memory control circuit unit is further configured to issue a second read command sequence to instruct reading a second codeword from a second physical unit among the physical units, wherein the memory control circuit unit is further configured to perform a second parity-check operation on the second codeword to obtain a plurality of second syndromes of the second codeword before the second codeword is decoded, wherein the memory control circuit unit is further configured to accumulate the second syndromes to obtain a second syndrome sum, wherein the error checking and correcting circuit is further configured to decode the second codeword by the second decoding engine in response to that the second syndrome sum is not lower than the default syndrome sum, wherein a first power consumption of the first decoding engine for decoding the first codeword is lower than a second power consumption of the second decoding engine for decoding the second codeword, wherein the memory control circuit unit is further configured to issue a third read command sequence to instruct reading a third codeword from a third physical unit among the physical units, wherein the memory control circuit unit is further configured to estimate error level information of the third codeword, wherein the error level information comprises at least one of a programming count of the third physical unit, a reading count of the third physical unit, an erasing count of the third physical unit, a third syndrome sum of the third codeword, a bit error rate of the third codeword, and a channel noise intensity of a transmission medium for transmitting the third codeword, wherein the memory control circuit unit is further configured to determine whether the error level information of the third codeword meets a default condition, wherein the error checking and correcting circuit is further configured to decode the third codeword by the first decoding engine in response to that the error level information of the third codeword meets the default condition, wherein the error checking and correcting circuit is further configured to decode the third codeword by the second decoding engine in response to that the error level information of the third codeword does not meet the default condition.

9. The memory storage device according to claim 8, wherein the operation of the memory control circuit unit determining whether the error level information of the third codeword meets the default condition comprises:

determining that the error level information of the third codeword meets the default condition if one of the following conditions is met: the bit error rate is lower than a default bit error rate, the channel noise intensity is lower than a default channel noise intensity, the programming count is less than a default programming count, the reading count is less than a default reading count, the erasing count is less than a default erasing count, and the third syndrome sum is lower than the default syndrome sum.

10. The memory storage device according to claim 8, wherein the operation of the memory control circuit unit determining whether the error level information of the third codeword meets the default condition comprises:

determining that the error level information of the third codeword meets the default condition if a plurality of the following conditions are met: the bit error rate is lower than a default bit error rate, the channel noise intensity is lower than a default channel noise intensity, the programming count is less than a default programming count, the reading count is less than a default reading count, the erasing count is less than a default erasing count, and the third syndrome sum is lower than the default syndrome sum.

11. The memory storage device according to claim 8, wherein the operation of the memory control circuit unit estimating the error level information of the third codeword comprises:

performing a third parity-check operation on the third codeword to obtain a plurality of third syndromes of the third codeword; and accumulating the third syndromes to obtain the third syndrome sum.

12. The memory storage device according to claim 8, wherein the memory control circuit unit is further configured to issue a fourth read command sequence to instruct reading a fourth codeword from a fourth physical unit among the physical units, wherein the memory control circuit unit is further configured to directly input the fourth codeword to the first decoding engine to decode the fourth codeword by the first decoding engine if a battery power supplied to the memory control circuit unit is lower than a default power value and the battery power is not coupled to an external power charging source.

13. The memory storage device according to claim 8, wherein the memory control circuit unit is further configured to input the first codeword or a decoding result of the first decoding engine to the second decoding engine if the first decoding engine does not correct all errors in the first codeword.

14. The memory storage device according to claim 8, wherein the second decoding engine performs a second decoding operation of a low-density parity-check code based on a gradient descent bit flipping algorithm, a min sum algorithm, or a sum product algorithm if the first decoding engine performs a first decoding operation of the low-density parity-check code based on a bit flipping algorithm, wherein the second decoding engine performs the second decoding operation of the low-density parity-check code based on the min sum algorithm or the sum product algorithm if the first decoding engine performs the first decoding operation of the low-density parity-check code based on the gradient descent bit flipping algorithm, wherein the second decoding engine performs the second decoding operation of the low-density parity-check code based on the sum product algorithm if the first decoding engine performs the first decoding operation of the low-density parity-check code based on the min sum algorithm.

15. A memory control circuit unit adapted to control a rewritable non-volatile memory module comprising a plurality of physical units, the memory control circuit unit comprising:

a host interface configured to couple to a host system;

a memory interface configured to couple to the rewritable non-volatile memory module;

an error checking and correcting circuit comprising a first decoding engine and a second decoding engine; and a memory management circuit coupled to the host interface, the memory interface, and the error checking and correcting circuit, wherein the memory management circuit is configured to issue a first read command sequence to instruct reading a first codeword from a first physical unit among the physical units, wherein the memory management circuit is further configured to perform a first parity-check operation on the first codeword to obtain a plurality of first syndromes of the first codeword before the first codeword is decoded, wherein the memory management circuit is further configured to accumulate the first syndromes to obtain a first syndrome sum, wherein the error checking and correcting circuit is configured to decode the first codeword by the first decoding engine in response to that the first syndrome sum is lower than a default syndrome sum, wherein the memory management circuit is further configured to issue a second read command sequence to instruct reading a second codeword from a second physical unit among the physical units, wherein the memory management circuit is further configured to perform a second parity-check operation on the second codeword to obtain a plurality of second syndromes of the second codeword before the second codeword is decoded, wherein the memory management circuit is further configured to accumulate the second syndromes to obtain a second syndrome sum, wherein the error checking and correcting circuit is further configured to decode the second codeword by the second decoding engine in response to that the second syndrome sum is not lower than the default syndrome sum, wherein a first power consumption of the first decoding engine for decoding the first codeword is lower than a second power consumption of the second decoding engine for decoding the second codeword, wherein the memory management circuit is further configured to issue a third read command sequence to instruct reading a third codeword from a third physical unit among the physical units, wherein the memory management circuit is further configured to estimate error level information of the third codeword, wherein the error level information comprises at least one of a programming count of the third physical unit, a reading count of the third physical unit, an erasing count of the third physical unit, a third syndrome sum of the third codeword, a bit error rate of the third codeword, and a channel noise intensity of a transmission medium for transmitting the third codeword, wherein the error checking and correcting circuit is further configured to determine whether the error level information of the third codeword meets a default condition, wherein the error checking and correcting circuit is further configured to decode the third codeword by the first decoding engine in response to that the error level information of the third codeword meets the default condition, wherein the error checking and correcting circuit is further configured to decode the third codeword by the second decoding engine in response to that the error level information of the third codeword does not meet the default condition.

16. The memory control circuit unit according to claim 15, wherein the operation of the error checking and correcting circuit determining whether the error level information of the third codeword meets the default condition comprises:

determining that the error level information of the third codeword meets the default condition if one of the following conditions is met: the bit error rate is lower than a default bit error rate, the channel noise intensity is lower than a default channel noise intensity, the programming count is less than a default programming count, the reading count is less than a default reading count, the erasing count is less than a default erasing count, and the third syndrome sum is lower than the default syndrome sum.

17. The memory control circuit unit according to claim 15, wherein the operation of the error checking and correcting circuit determining whether the error level information of the third codeword meets the default condition comprises:

determining that the error level information of the third codeword meets the default condition if a plurality of the following conditions are met: the bit error rate is lower than a default bit error rate, the channel noise intensity is lower than a default channel noise intensity, the programming count is less than a default programming count, the reading count is less than a default reading count, the erasing count is less than a default erasing count, and the third syndrome sum is lower than the default syndrome sum.

18. The memory control circuit unit according to claim 15, wherein the operation of the memory management circuit estimating the error level information of the third codeword comprises:

performing a third parity-check operation on the third codeword to obtain a plurality of third syndromes of the third codeword; and accumulating the third syndromes to obtain the third syndrome sum.

19. The memory control circuit unit according to claim 15, wherein the memory management circuit is further configured to issue a fourth read command sequence to instruct reading a fourth codeword from a fourth physical unit among the physical units, wherein the error checking and correcting circuit is further configured to directly input the fourth codeword to the first decoding engine and decode the fourth codeword by the first decoding engine if a battery power supplied to the memory control circuit unit is lower than a default power value and the battery power is not coupled to an external power charging source.

20. The memory control circuit unit according to claim 15, wherein the error checking and correcting circuit is further configured to input the first codeword or a decoding result of the first decoding engine to the second decoding engine if the first decoding engine does not correct all errors in the first codeword.

21. The memory control circuit unit according to claim 15, wherein the second decoding engine performs a second decoding operation of a low-density parity-check code based on a gradient descent bit flipping algorithm, a min sum algorithm, or a sum product algorithm if the first decoding engine performs a first decoding operation of the low-density parity-check code based on a bit flipping algorithm, wherein the second decoding engine performs the second decoding operation of the low-density parity-check code based on the min sum algorithm or the sum product algorithm if the first decoding engine performs the first decoding operation of the low-density parity-check code based on the gradient descent bit flipping algorithm, wherein the second decoding engine performs the second decoding operation of the low-density parity-check code based on the sum product algorithm if the first decoding engine performs the first decoding operation of the low-density parity-check code based on the min sum algorithm.

* * * * *